United States Patent
Schwager et al.

(10) Patent No.: US 8,576,562 B2
(45) Date of Patent: Nov. 5, 2013

(54) LATCHING SYSTEM FOR CONVERTIBLE INFORMATION HANDLING SYSTEM

(75) Inventors: Mark A. Schwager, Cedar Park, TX (US); Andrew Tosh, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 317 days.

(21) Appl. No.: 13/028,327

(22) Filed: Feb. 16, 2011

(65) Prior Publication Data

US 2012/0206873 A1   Aug. 16, 2012

(51) Int. Cl.
*H05K 5/00* (2006.01)
*H05K 7/00* (2006.01)

(52) U.S. Cl.
USPC ............ 361/679.58; 361/679.26; 361/679.27; 361/679.55; 361/679.57

(58) Field of Classification Search
USPC ............. 361/679.26, 679.27, 679.55, 679.57, 361/679.58
See application file for complete search history.

(56) References Cited

U.S. PATENT DOCUMENTS

| | | | |
|---|---|---|---|
| 5,253,142 A * | 10/1993 | Weng | 361/679.56 |
| 6,034,867 A * | 3/2000 | Seo | 361/679.27 |
| 6,517,129 B1 * | 2/2003 | Chien et al. | 292/251.5 |
| 6,659,516 B2 | 12/2003 | Wang et al. | |
| 2003/0011972 A1 * | 1/2003 | Koo | 361/681 |
| 2005/0036284 A1 * | 2/2005 | Kang | 361/683 |
| 2006/0002062 A1 * | 1/2006 | Kwon et al. | 361/680 |
| 2006/0056140 A1 | 3/2006 | Lev | |
| 2007/0070593 A1 * | 3/2007 | Wu et al. | 361/683 |
| 2007/0171604 A1 * | 7/2007 | Hong et al. | 361/683 |
| 2008/0087050 A1 * | 4/2008 | Chen | 70/57 |
| 2008/0256805 A1 * | 10/2008 | Maddison | 30/134 |

* cited by examiner

*Primary Examiner* — Anthony Haughton
(74) *Attorney, Agent, or Firm* — Haynes and Boone, LLP

(57) ABSTRACT

An information handling system includes a base portion with a moveable first latch member. A display portion is moveable relative to the base portion. A first side of the display portion includes a first side latch engagement member and a second side of the display portion includes a second side latch engagement member. The display portion includes a first latch member actuator that is operable, in response to positioning the first side of the display portion adjacent the base portion, to move the first latch member adjacent the first side latch engagement member to resist movement of the display portion relative to the base portion and, in response to positioning the second side of the display portion adjacent the base portion, to move the first latch member adjacent the second side latch engagement member to resist movement of the display portion relative to the base portion.

20 Claims, 16 Drawing Sheets

__US 8,576,562 B2__

LATCHING SYSTEM FOR CONVERTIBLE INFORMATION HANDLING SYSTEM

BACKGROUND

The present disclosure relates generally to information handling systems (IHSs), and more particularly to a latching system for a convertible IHS.

As the value and use of information continues to increase, individuals and businesses seek additional ways to process and store information. One option is an IHS. An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Some IHS's are convertible between a laptop/notebook mode and a tablet/slate mode. In the laptop/notebook mode, a display portion of the IHS is moveable through a clamshell range of motion between a closed orientation in which the display portion is immediately adjacent a base portion of the IHS such that a display screen on the display portion faces the base portion, and an open orientation in which the display portion and display screen are located at an angle (typically 90-120 degrees) relative to the base portion of the IHS. To convert to the tablet/slate mode, the display portion of the IHS may be rotated 180 degrees about an axis that is perpendicular to the base portion, and then moved through the clamshell range of motion into the closed orientation such that the display portion is again positioned immediately adjacent the base portion of the IHS, but now with the display screen located opposite the display portion from the base portion such that the display screen faces away from the base portion. Conventional latching systems include a latch member that remains protruded from the display portion and only allow the latching of one side of the display portion to the base portion, which raises issues with regard to convertible IHSs that include two sides of a display portion that are desirable to be able to latch to the base portion. Furthermore, conventional latching systems typically include a release mechanism that is only actuatable in one direction to release the display portion from the base portion, which raises issues with regard to convertible IHSs as such latching systems would require a user to move the latch in opposite directions to release the display portion based on which mode the IHS is in.

Accordingly, it would be desirable to provide an improved latching system for a convertible IHS.

SUMMARY

According to one embodiment, an information handling system includes a base portion that houses a processor and a memory coupled to the processor, wherein the base portion includes a first latch member that is moveable relative to the base portion, a display portion that includes a display screen and that is moveable relative to the base portion, wherein a first side of the display portion includes a first side latch engagement member and a second side of the display portion includes a second side latch engagement member, and a second latch member that is moveably coupled to the display portion and that includes a first latch member actuator that is operable, in response to positioning the first side of the display portion adjacent the base portion, to move the first latch member such that the first latch member is operable to engage the first side latch engagement member to resist movement of the display portion relative to the base portion and, in response to positioning the second side of the display portion adjacent the base portion, to move the first latch member such that the first latch member is operable to engage the second side latch engagement member to resist movement of the display portion relative to the base portion.

BRIEF DESCRIPTION OF THE DRAWINGS

FIG. 4a is a exploded perspective view illustrating an embodiment of a second latch device used with the IHS of FIGS. 2a and 2b and the first latch device of FIG. 3a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
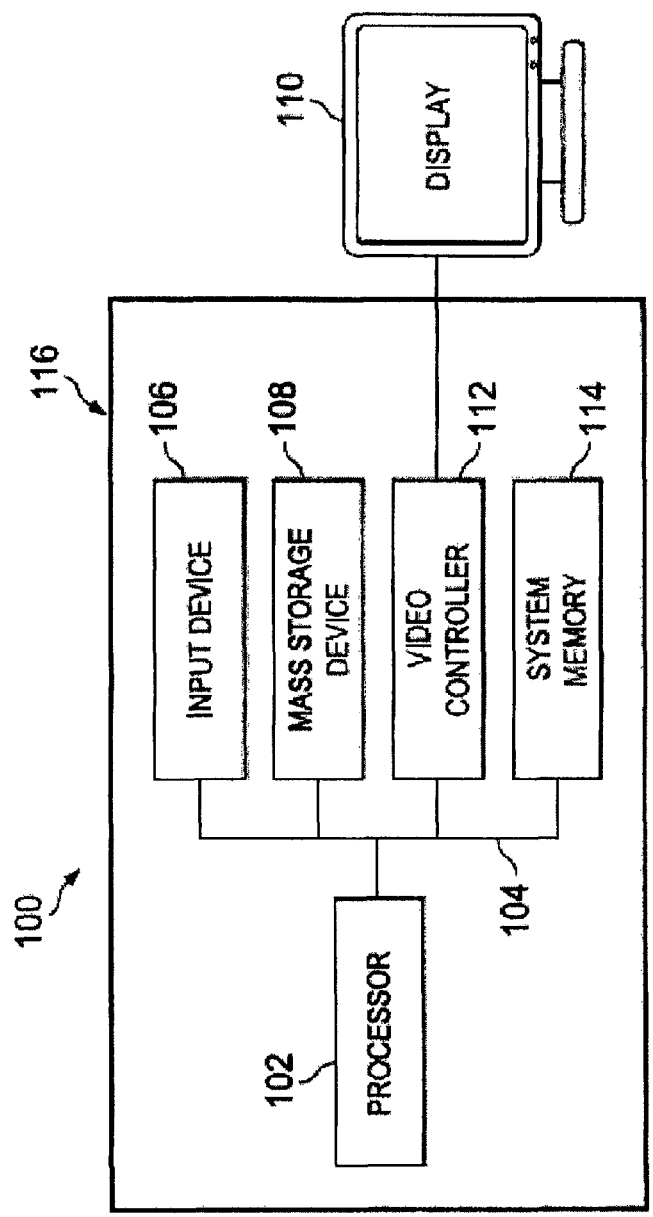
FIG. 1 is a schematic view illustrating an embodiment of an information handling system (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
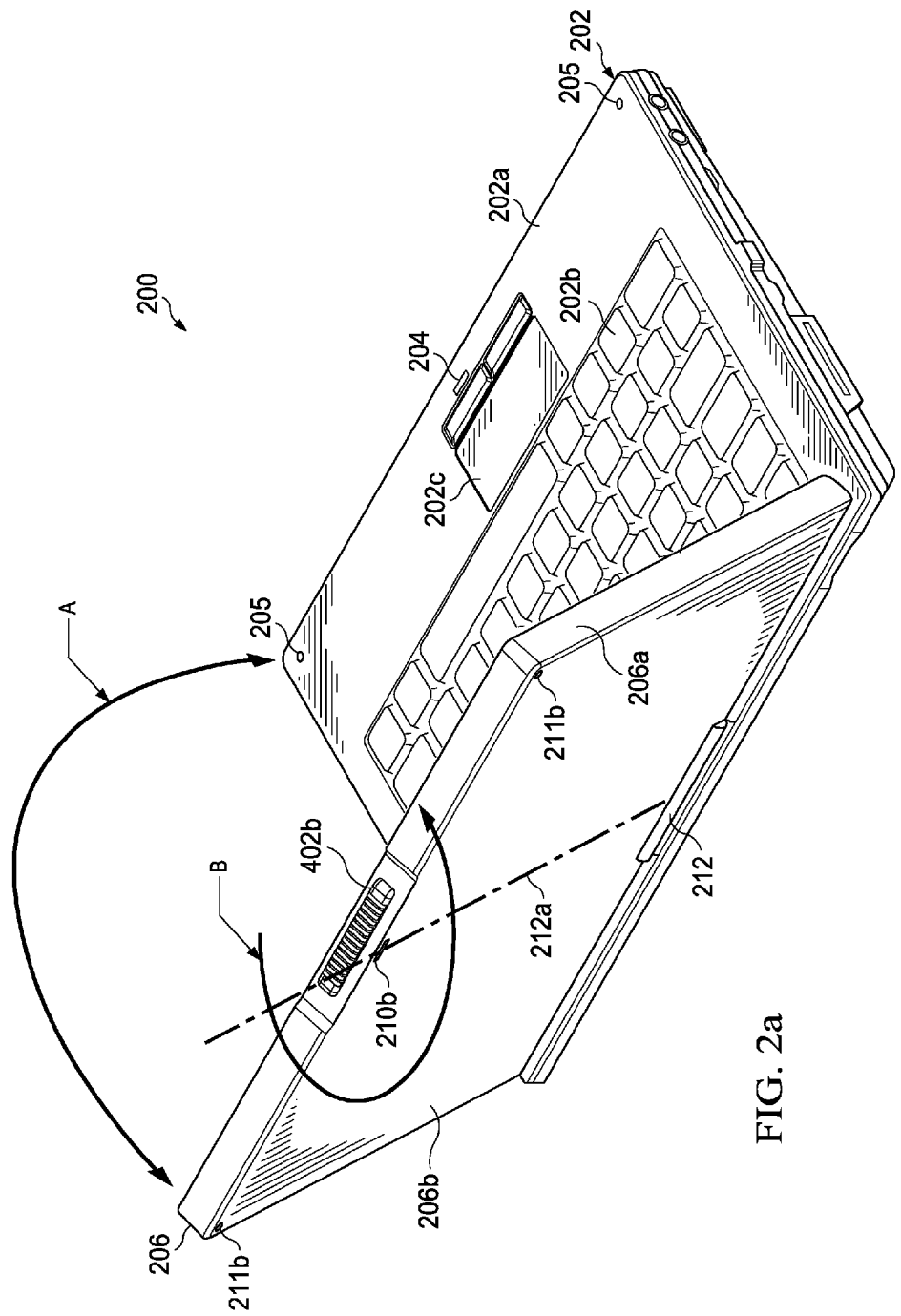
FIG. 2a is a perspective view illustrating an embodiment of an IHS in a laptop/notebook mode.
Figure 2B:
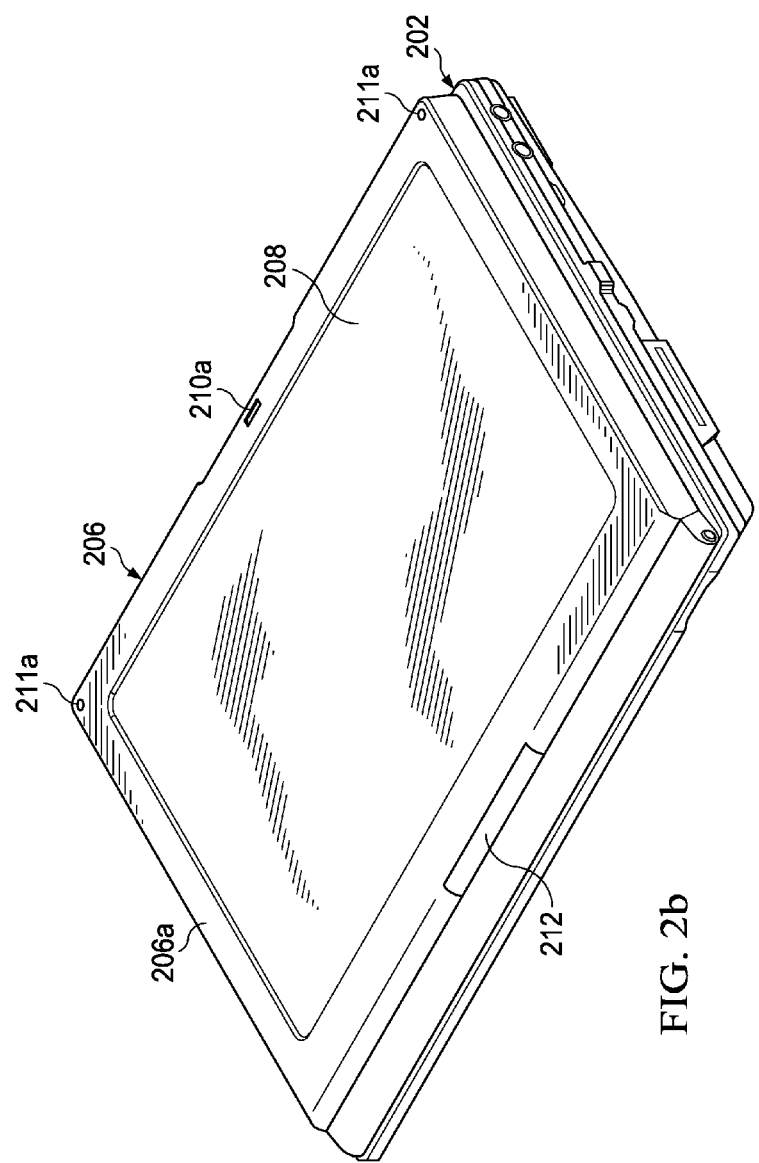
FIG. 2b is a perspective view illustrating an embodiment of the IHS of FIG. 2a in a tablet/slate mode.

Referring now to FIGS. 2a and 2b, a convertible IHS 200 is illustrated that may be, for example, the IHS 100 discussed above with reference to FIG. 1. The convertible IHS 200 includes a base portion 202 having a top surface 202a that includes a keyboard 202b and a touchpad 202c located adjacent the top surface 202a. In an embodiment, the base portion 202 may be the chassis 116, described above with reference to FIG. 1, and may house some or all of the components of the IHS 100. A base latch member aperture 204 is defined by the base portion 202, located on the top surface 202a of the base member 202, and is described in further detail below. A pair of stabilizer members 205 (e.g., protrusions, detents, etc.) are located at corners of the top surface 202a of the base portion 202 on opposite sides of the touchpad 202c. The convertible IHS 200 also includes a display portion 206 having a front surface 206a and a rear surface 206b that is located opposite the display portion 206 from the front surface 206a. A display screen 208 is located adjacent the front surface 202a of the display portion 206. A first display latch member aperture 210a is defined by the display portion 206, located on the front surface 206a of the display portion 206 adjacent the display screen 208, and is described in further detail below. A second display latch member aperture 210b is defined by the display portion 206, located on the rear surface 206b of the display portion 206, and is described in further detail below. A pair of stabilizer members 211a (e.g., protrusions, detents, etc.) are located at corners of the front surface 206a of the display portion 202 on opposite sides of the display screen 208. A pair of stabilizer members 211b (e.g., protrusions, detents, etc.) are located at corners of the rear surface 206a of the display portion 202 on opposite sides of the second display latch member aperture 210b. The display portion 206 is moveably coupled to the base portion 202 by a coupling 212 that allows the display portion 206 to move relative to the base portion 202 in each of a plurality of different IHS modes, described in further detail below.

For example, in a laptop/notebook mode, the display portion 206 is moveable about the coupling 212 through a range of motion A that is illustrated in FIG. 2a. In the laptop/notebook mode, the display portion 206 may move between a closed orientation in which the display portion 206 is immediately adjacent the base portion 202 such that the display screen 208 faces the top surface 202a of the base portion 202, and an open orientation (illustrated) in which the display portion 206 and display screen 208 are located at an angle (e.g., between 90-120 degrees in the embodiment illustrated in FIG. 2a) relative to the base portion 206. To convert to the tablet/slate mode, the display portion 206 may be rotated 180 degrees about an axis 212a of the display portion 206 through a range of motion B that is illustrated in FIG. 2a such that positions of the rear surface 206b of the display portion 206 and the display screen 208 illustrated in FIG. 2a are reversed, and then moved through the clamshell range of motion A until the display portion 206 is positioned immediately adjacent the base portion 202, but now with the display screen 208 located opposite the display portion 206 from the base portion 202 such that the display screen 208 faces away from the top surface 206a of the base portion 206, as illustrated in FIG. 2b. In an embodiment, the coupling 212 includes detents to provide a user with feedback when the display portion 206 is in the proper orientation for the laptop/notebook mode and/or the tablet/slate mode. In either of the laptop/notebook mode and/or the tablet/slate mode, the stabilizer members 205, 211a and 211b stabilize the display portion 206 relative to the base portion 202. The positioning of the stabilizer members 211a and 221b at the corners of the display portion 206 opposite the base portion 202 and away from the coupling 212 provides improved control of display portion movement about the coupling 212, and ensure that there are no protrusions on the base portion 202 that can damage components of the display portion 206 (e.g., LCD glass.) While a specific embodiment of a convertible IHS 200 has been described above that includes the coupling 212 to allow conversion from a laptop/notebook mode to a tablet/slate mode, one of skill in the art will recognize that a variety of other convertible IHS's with different moveable couplings for conversion between IHS modes will fall within the scope of the presented disclosure.

Figure 3A:
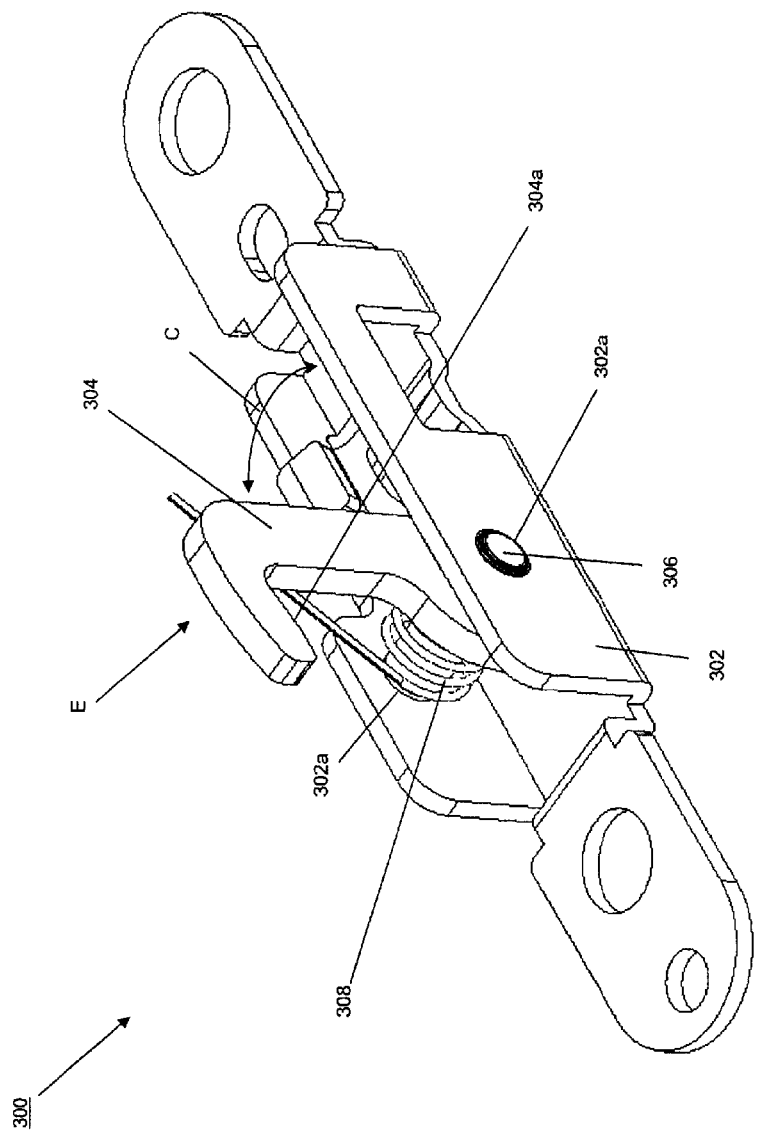
FIG. 3a is a perspective view illustrating an embodiment of a first latch device used with the IHS of FIGS. 2a and 2b.
Figure 3B:
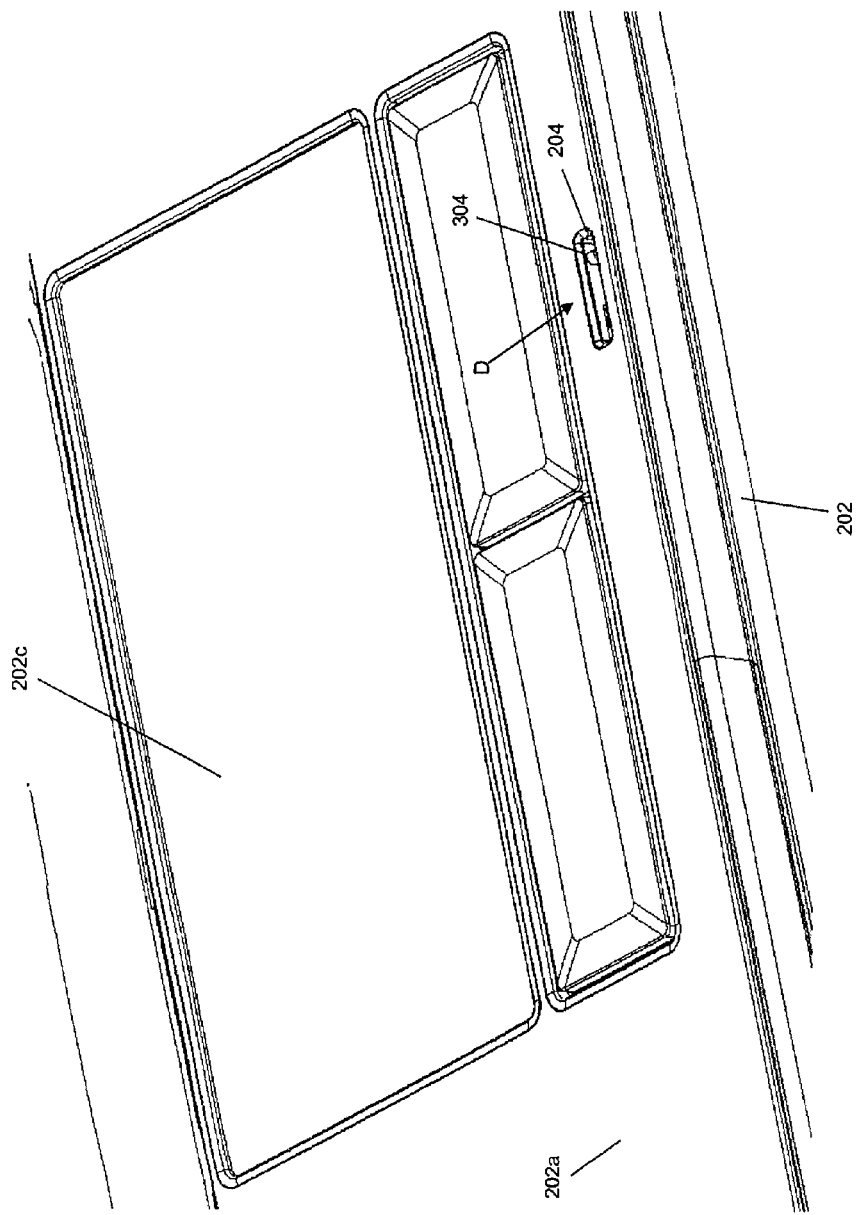
FIG. 3b is a perspective view illustrating an embodiment of the first latch device of FIG. 3a coupled to the IHS of FIGS. 2a and 2b.
Figure 3C:
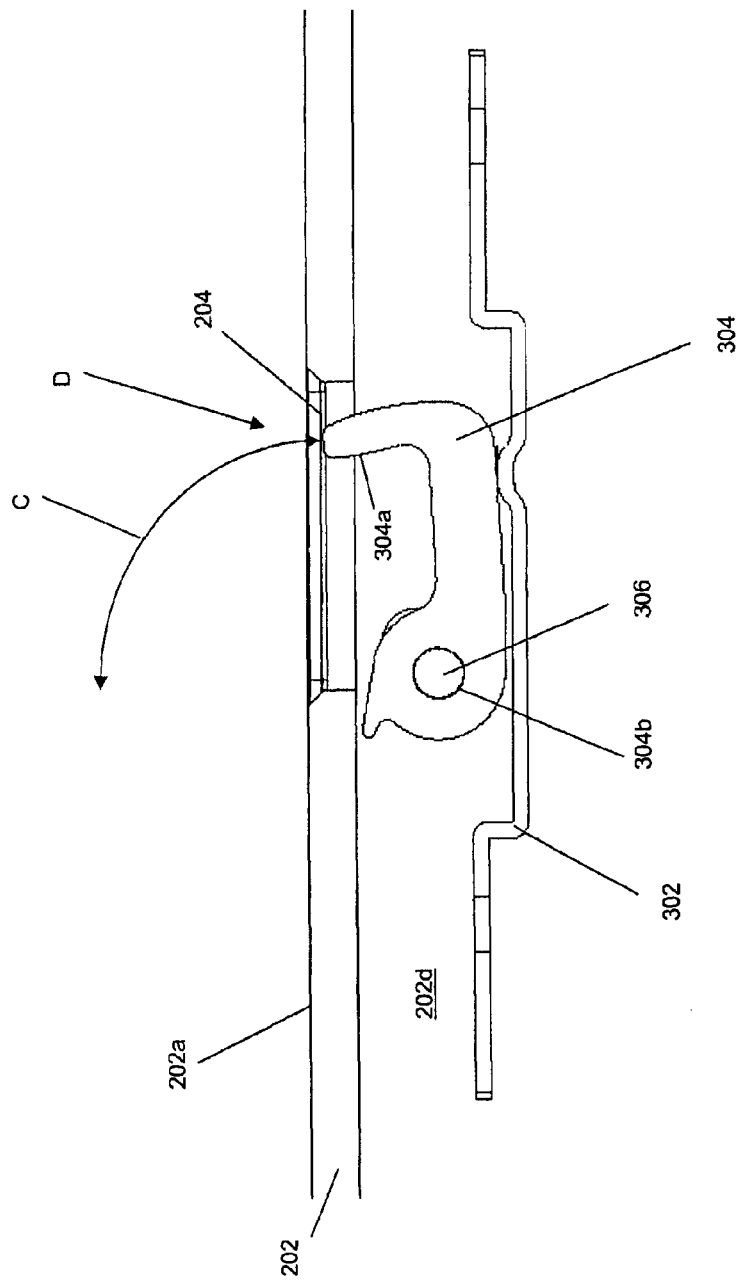
FIG. 3c is a cross sectional view illustrating an embodiment of the first latch device of FIG. 3a coupled to the IHS of FIGS. 2a and 2b.

Referring now to FIGS. 3a, 3b, and 3c, a base latch device 300 is illustrated. The base latch device 300 includes a mounting member 302 that defines a pair of spaced apart mounting apertures 302a. A base latch member 304 includes a securing surface 304a and is moveably coupled to the mounting member 302 through a mounting rod 306 that is located in the mounting apertures 302a and extends through an aperture 304b defined by the base latch member 304. In an embodiment, the base latch member 304 includes a magnetic material or a metal material. The moveable coupling of the base latch member 304 to the mounting member 302 allows the base latch member 304 to move through a range of motion C.

A resilient member 308 such as, for example, a spring, is coupled to the base latch member 304 to bias the base latch member 304 as described in further detail below. The mounting member 302 may be mounted in a housing 202d defined by the base portion 202 such that the base latch member 304 is located adjacent the base latch member aperture 204, as illustrated in FIG. 3c. The resilient member 308 biases the base latch member 304 into a retracted position D, illustrated in FIGS. 3b and 3c, in which the base latch member 304 is retracted into the housing 202d define by the base portion 202 and does not extend through the base latch member aperture 204 and out past the top surface 202a of the base portion 202. However, as described in further detail below, a force may be applied to the base latch member 304 such that the bias provided by the resilient member 208 is overcome and the base latch member 304 becomes positioned in an extended position E, illustrated in FIG. 3a.

Referring now to FIGS. 4a, 4b, 4c, and 4d, a display latch device 400 is illustrated. The display latch device 400 includes a display latch member 402 including a base 402a and an activator member 402b extending from the base 402a. The base 402a defines an actuator housing 404 and includes a first release member 406a (visible in FIGS. 4a and 4b) extending from a first side 402aa of the base 402a and a second release member 406b (visible in FIG. 4b) extending from a second side 402ab of the base 402a. A base member actuator 408 is located in the actuator housing 404. In an embodiment, the base member actuator 408 includes a magnetic material or a metal material. The display latch device 400 also includes a first side latch engagement member 410 having a rod 410a coupled with a resilient member 410b, along with an actuator portion 410c that is located on a distal end of the rod 410a, defines a display latch member channel 410d, and includes a stop member 410e located opposite the actuator portion 410c from the display latch member channel 410d. A second side latch engagement member 412 is substantially similar to the first side latch engagement member 410 and includes a rod 412a coupled with a resilient member 412b, along with an actuator portion 412c that is located on a distal end of the rod 412a, defines a display latch member channel 412d, and includes a stop member 412e located opposite the actuator portion 412c from the display latch member channel 412d.

Figure 4A:
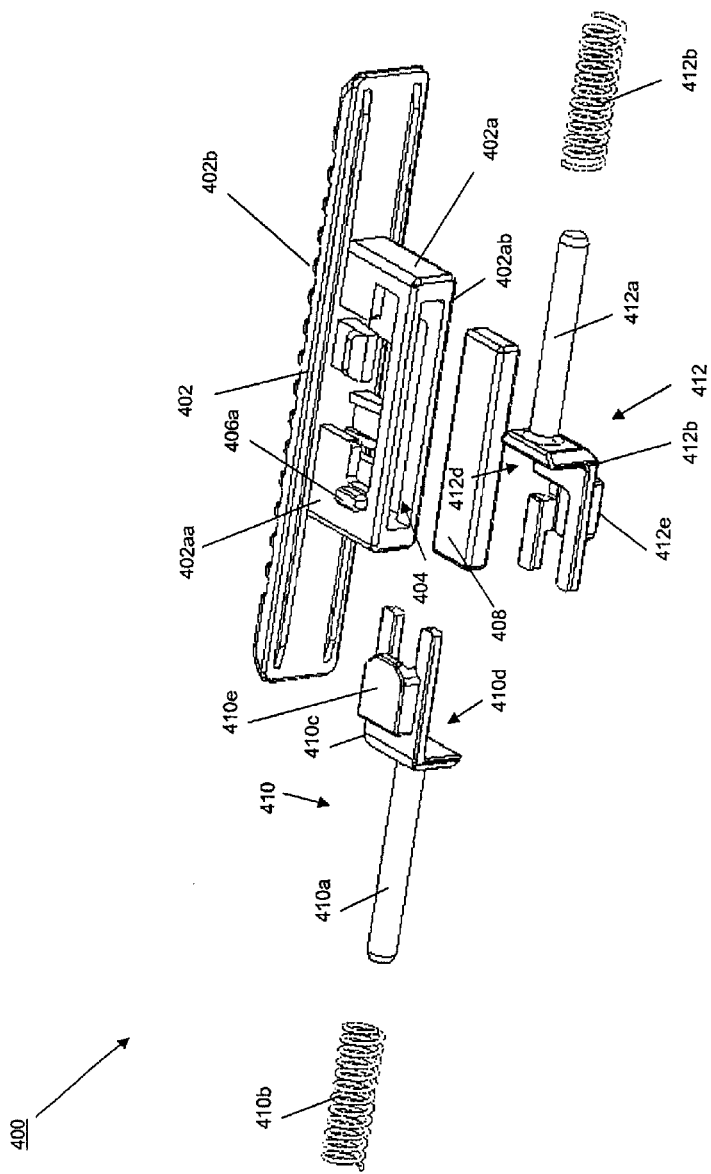
Figure 4B:
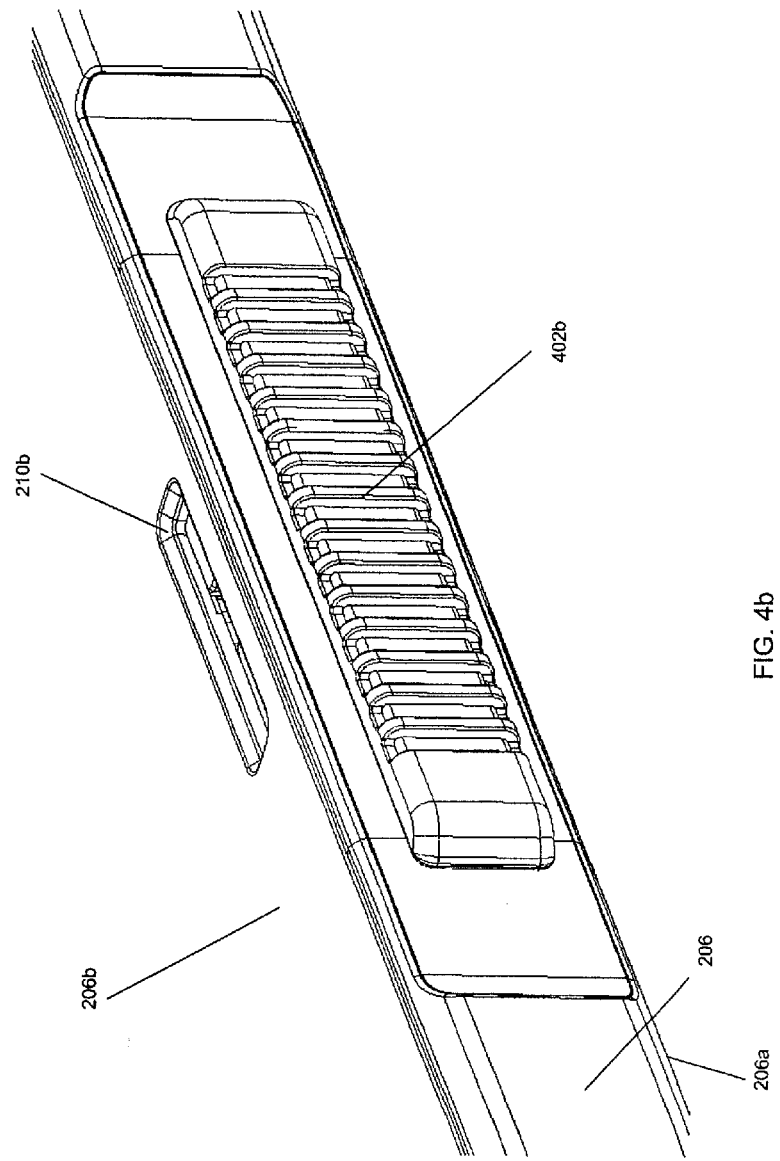
FIG. 4b is a perspective view illustrating an embodiment of the second latch device coupled to the IHS of FIGS. 2a and 2b.
Figure 4C:
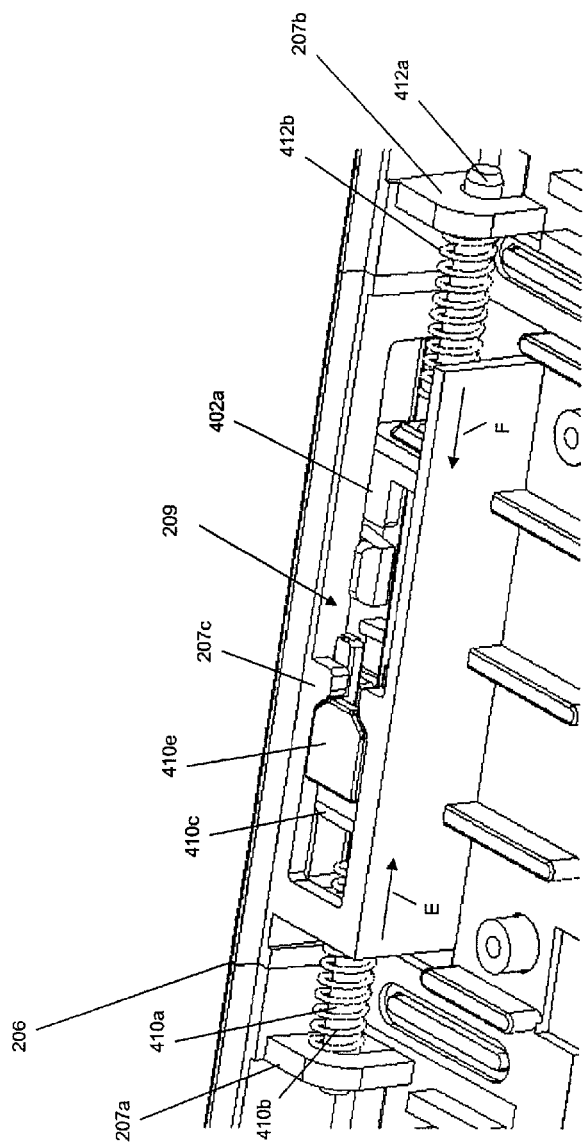
FIG. 4c is a cut-away perspective view illustrating an embodiment of the second latch device coupled to the IHS of FIGS. 2a and 2b.
Figure 4D:
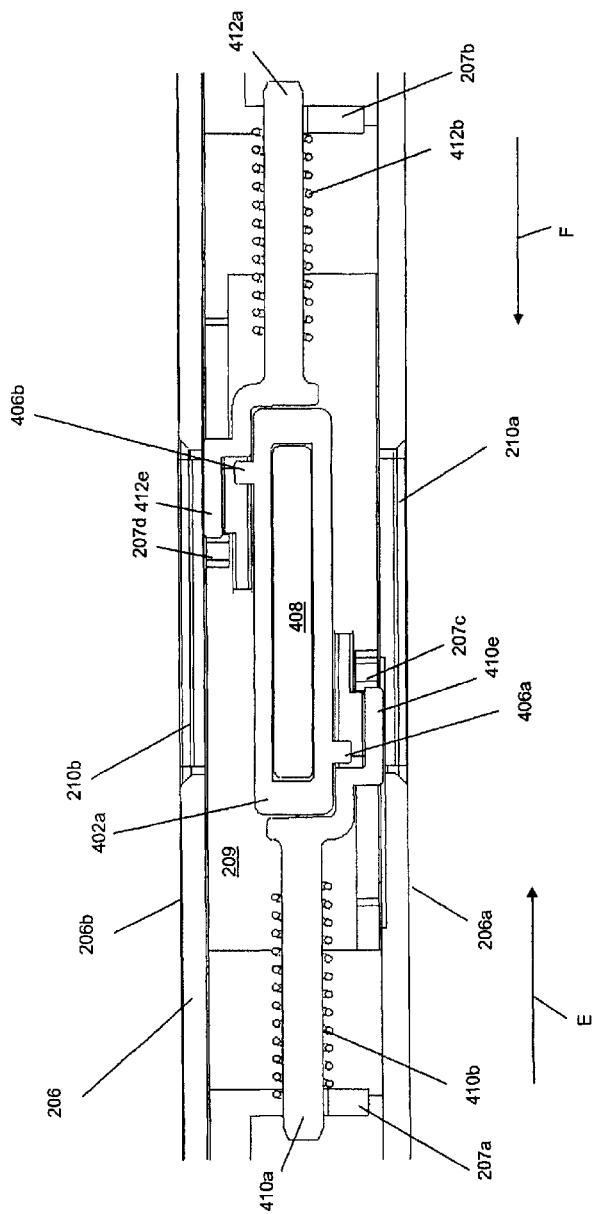
FIG. 4d is a cross-sectional view illustrating an embodiment of the second latch device coupled to the IHS of FIGS. 2a and 2b.

The display latch member 402 is coupled to the display portion 206 such that the activator member 402b is located adjacent a surface on the display portion 206 that extends between the front surface 206a and the rear surface 206b, as illustrated in FIG. 4b, and the base 402a extends into a housing 209 defined by the display portion 206, as illustrated in FIGS. 4c and 4d. The first side latch engagement member 410 and the second side latch engagement member 412 are coupled to the display portion 206 such that they are on opposite sides of the base 402a of the display latch member 402, as illustrated in FIGS. 4c and 4d. The display portion 206 includes engagement member mounts 207a and 207b that accept the rods 410a and 412a, respectively, on the first side latch engagement member 410 and the second side latch engagement member 412, respectively. The display portion 206 also includes engagement member stops 207c (visible in FIGS. 4c and 4d) and 207d (visible in FIG. 4d), that are operable to engage the stop members 410e and 412e, respectively, on the first side latch engagement member 410 and the second side latch engagement member 412, respectively, as described in further detail below. The resilient member 410b engages the engagement member mount 207a to bias the first side latch engagement member 410 in a direction E until the stop member 410e on the first side latch engagement member 410 engages the engagement stop 207c in a base latch member engagement position, and the resilient member 412b engages the engagement member mount 207b to bias the second side latch engagement member 412 in a direction F until the stop member 412e on the second side latch engagement member 412 engages the engagement stop 207d in a base latch member engagement position, as illustrated in FIG. 4d.

Figure 5A:
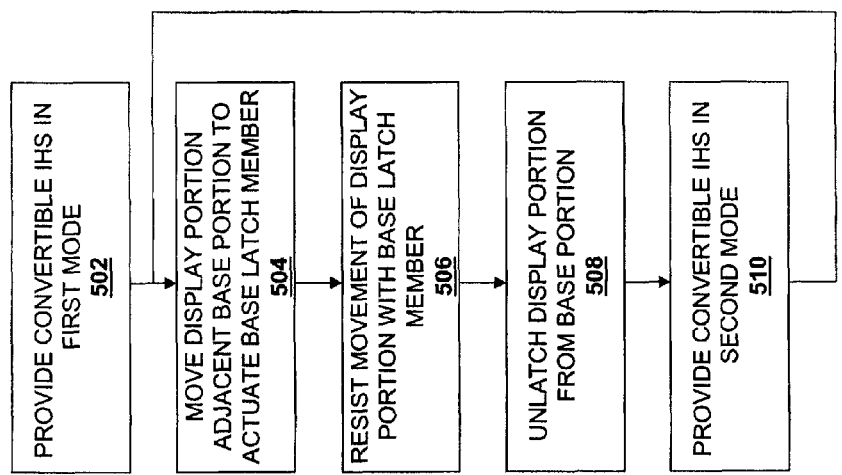
FIG. 5a is a flow chart illustrating an embodiment of a method for latching a convertible IHS.
Figure 5B:
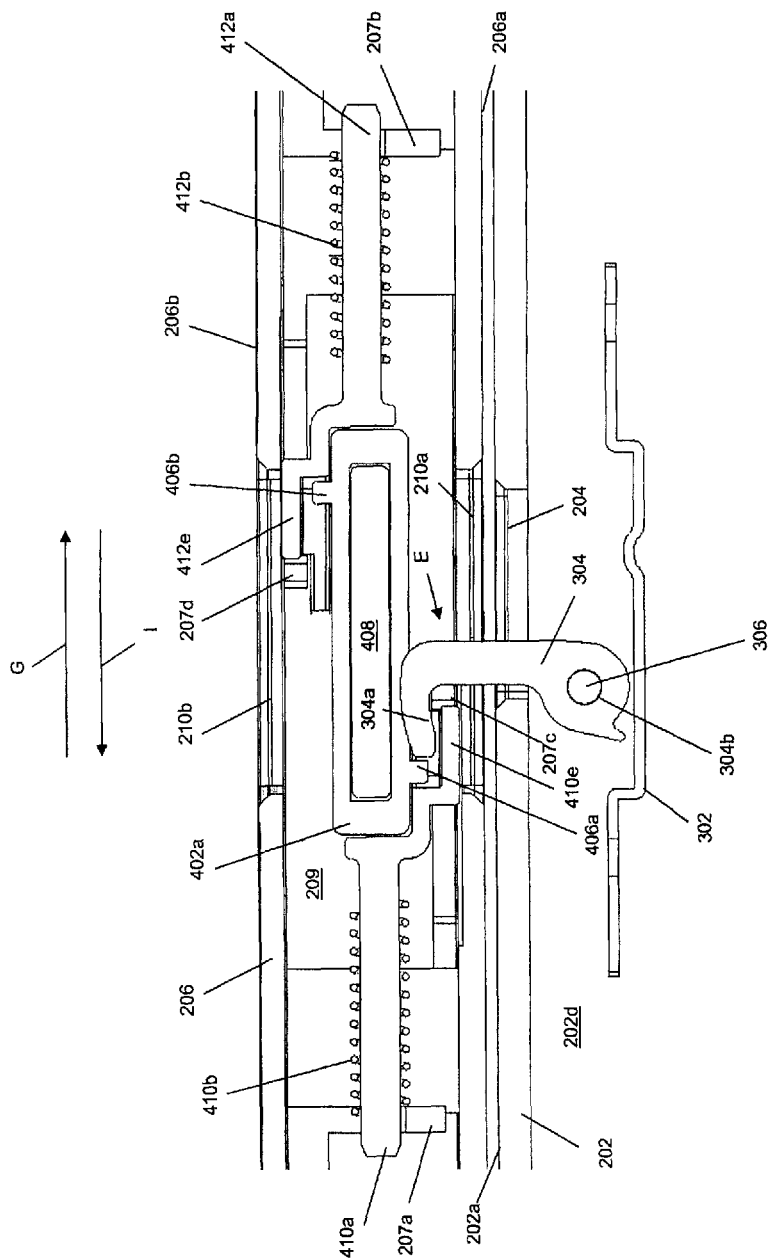
FIG. 5b is a cross-sectional view illustrating an embodiment the second latch device of FIG. 4a actuating the first latch device of FIG. 3a in the IHS of FIGS. 2a and 2b to latch the convertible IHS.

Referring now to FIGS. 2a, 3c, 5a, and 5b, a method 500 for latching a convertible IHS is illustrated. The method 500 begins at block 502 where a convertible IHS in provided in a first mode. In an embodiment, the convertible IHS 200 is provided in the laptop/notebook mode illustrated and discussed above with reference to FIG. 2a. The method 500 then proceeds to block 504 where a display portion is moved adjacent a base portion to actuate a base latch member. In the laptop/notebook mode, a user may wish to latch the display portion 206 to the base portion 202 when the convertible IHS 200 is not being used. As described above, in the laptop/notebook mode, the display portion 206 may be moved from the position illustrated in FIG. 2a (with the display portion 206 and display screen 208 located at a 90-120 degree angle relative to the base portion 202) through the range of motion A in order to bring the display portion 206 adjacent the base portion 202. With the display portion 206 in the position illustrated in FIG. 2a, the resilient member 308 biases the base latch member 304 in the base portion 202 into the retracted position D, illustrated in FIGS. 3b and 3c. However, as the display portion 206 is moved adjacent the base portion 202, the base member actuator 408 moves adjacent the base latch member 304 and provides a force on the base latch member 304 that overcomes the bias provided by the resilient member 208 and moves the base latch member 304 through its range of motion C from the retracted position D to the extended position E, illustrated in FIG. 5b. In an embodiment, the force provided on the base latch member 304 from the base member actuator 408 is due to a magnetic attraction between the base latch member 304 and the base member actuator 408 (e.g., one of the base latch member 304 and the base member actuator 408 is a magnetic material while the other is a metal material.) Movement of the base latch member 304 into the extended position E results in the base latch member 304 extending through the base latch member aperture 204 defined by the base portion 202, out past the top surface 202a of the base portion 202, through the first display latch member aperture 210a defined by the display portion 206, and into the housing 209 defined by the display portion 206 such that the securing surface 304a on the base latch member 304 is located immediately adjacent the stop member 410e on the first side latch engagement member 410, as illustrated in FIG. 5b. With the display portion 206 located adjacent the base portion 202, the stabilizer members 205 on the base portion 202 engage the stabilizer members 211a on the display portion 206. In an embodiment, the base latch member 304 may engage some portion of the display latch device 400 to provide an user-audible noise (e.g., a 'click') to provide feedback to the user that the IHS is latched and secure.

The method 500 then proceeds to block 506 where movement of the display portion is resisted with the base latch member. As can be seen in FIG. 5b, with the base latch member 304 in the extended position E, any attempt to move the display portion 206 away from the base portion 202 will be resisted by the engagement of the securing secure 304a on the base latch member 304 and the stop member 410e on the first side latch engagement member 410. Furthermore, with the stabilizer members 205 on the base portion 202 engaging the stabilizer members 211a on the display portion 206, movement of the display portion 206 relative to the base portion 202 in a plane that is parallel to the top surface 202a of the base portion 202 is resisted. Thus, as long as the latching system components (the base latching member and the first side latch engagement member 410) remain in the orientation illustrated in FIG. 5b, the display portion 206 will be latched to the base portion 202.

Figure 5C:
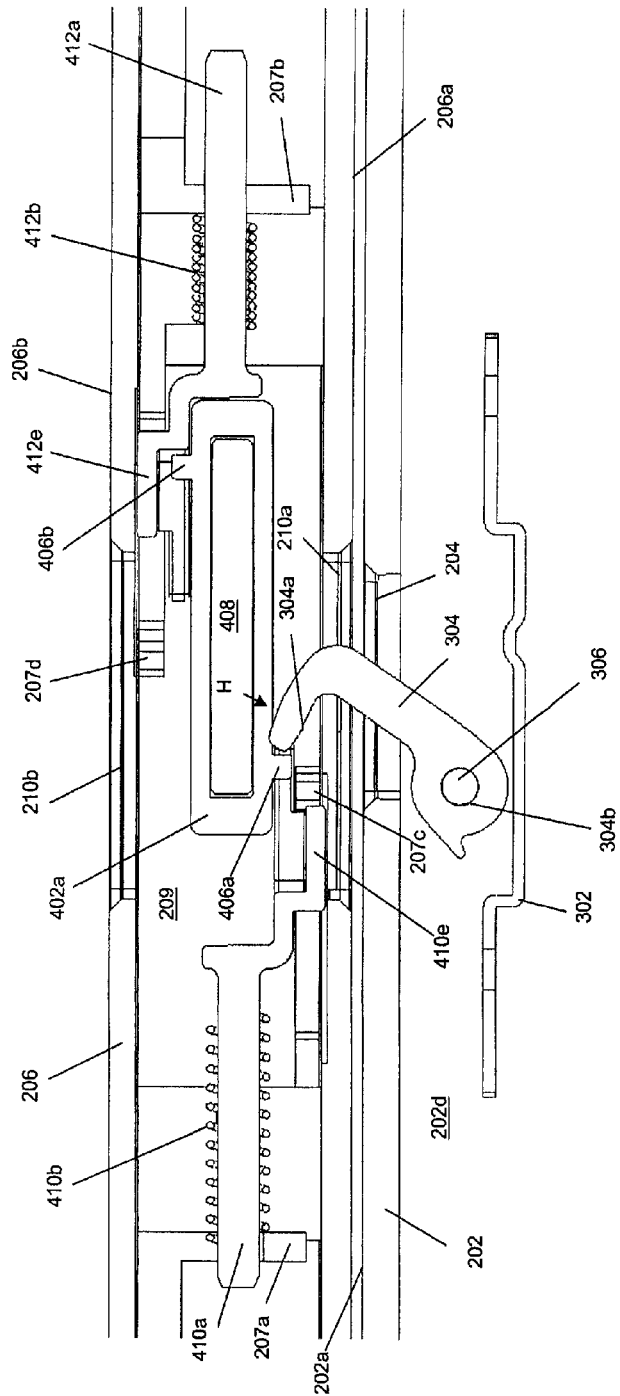
FIG. 5c is a cross-sectional view illustrating an embodiment the second latch device of FIG. 4a engaging the first latch device of FIG. 3a in the IHS of FIGS. 2a and 2b to provide a first option for unlatching the convertible IHS.

Referring now to FIGS. 5a, 5b, 5c, and 5d, the method 500 the proceeds to block 508 where the display portion is unlatched from the base portion. In the laptop/notebook mode, a user may wish to unlatch the display portion 206 from the base portion 202 in order to use the convertible IHS 200. The latching system described above gives the user two unlatching options for doing so. Using a first unlatching option, illustrated in FIG. 5c, the user moves the display latch member 402 from the position illustrated in FIG. 5b in a direction G. Movement of the display latch member 402 in the direction G causes the base 402a of the display latch member 402 to engage the actuator portion 412c of second side latch engagement member 412 and overcome the bias provided by the resilient member 412b to move the second side latch engagement member 412 such that the first release member 406a on the base 402a of the display latch member 402 engages the base latch member 304 and moves the base latch member 304 out of the extended position E and into a release position H, as illustrated in FIG. 5c. With the base latch member 304 in the release position H, the display portion 206 is unlatched from the base portion 202 and may be moved away from the base portion 202 and into the position illustrated in FIG. 2a. Movement of the display portion 206 away from the base portion 202 moves the base member actuator 408 away from the base latch member 304 such that the force on the base latch member 304 from the base member actuator 408 is no longer present, and the bias provided by resilient member 208 on the base latch member 304 will move the base member into the retracted position D, illustrated in FIGS. 3b and 3c.

Figure 5D:
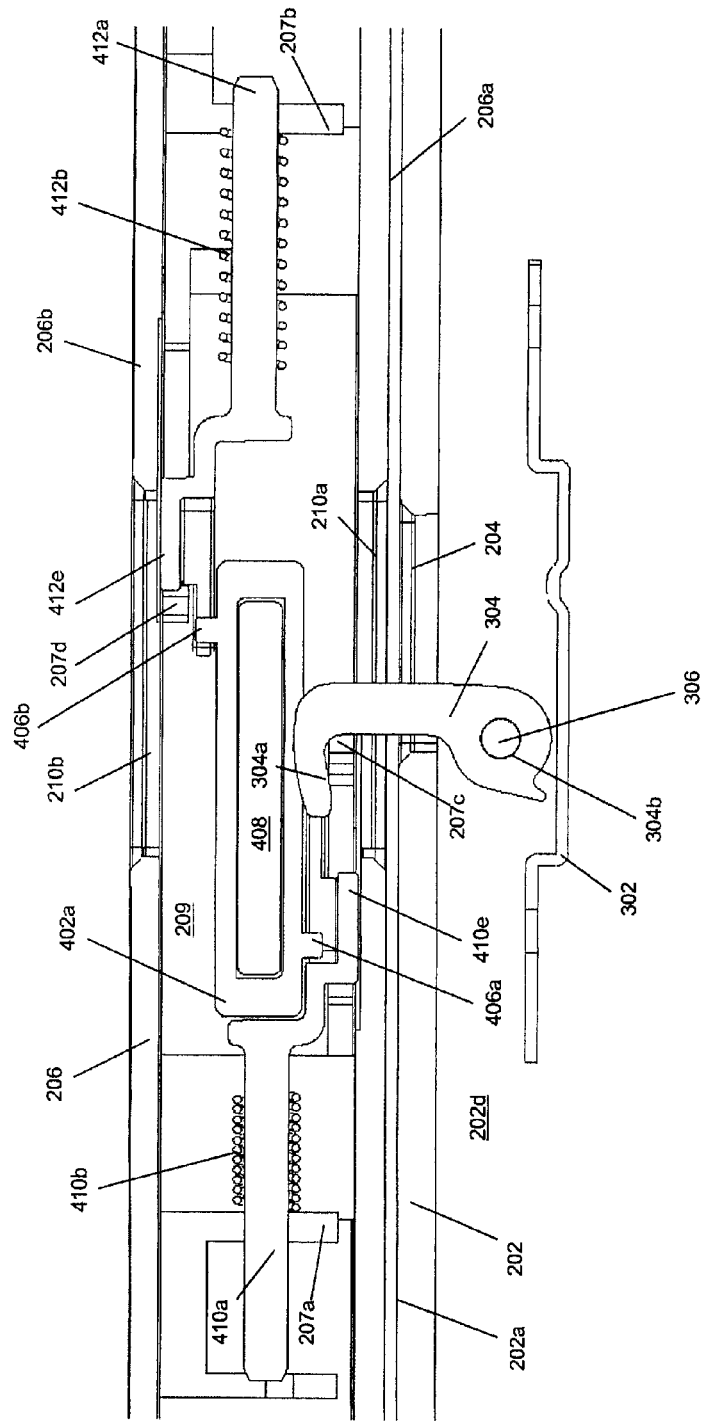
FIG. 5d is a cross-sectional view illustrating an embodiment the second latch device of FIG. 4a in the IHS of FIGS. 2a and 2b providing a second option for unlatching the convertible IHS.

Using a second unlatching option, illustrated in FIG. 5d, the user moves the display latch member 402 from the position illustrated in FIG. 5b in a direction I. Movement of the display latch member 402 in the direction I causes the base 402a of the display latch member 402 to engage the actuator portion 410c of first side latch engagement member 410 and overcome the bias provided by the resilient member 412b to move the first side latch engagement member 410 until the stop member 410e on the first side latch engagement member 410 is no longer adjacent the securing surface 304a on the base latch member 304, as illustrated in FIG. 5d. With the stop member 410e on the first side latch engagement member 410 no longer adjacent the securing surface 304a on the base latch member 304, the display portion 206 is unlatched from the base portion 202 and may be moved away from the base portion 202 and into the position illustrated in FIG. 2a. Movement of the display portion 206 away from the base portion 202 moves the base member actuator 408 away from the base latch member 304 such that the force on the base latch member 304 from the base member actuator 408 is no longer present, and the bias provided by resilient member 208 on the base latch member 304 will move the base member into the retracted position D, illustrated in FIGS. 3b and 3c.

In an embodiment, a chamfer lead-in may be added to a portion of the first side latch engagement member 410 that is adjacent the front surface 206a of the display portion 206 and that engages the base latch member 304, and to a portion of the second side latch engagement member 412 that is adjacent the rear surface 206b of the display portion 206 and that engages the base latch member 304. The chamfer lead-ins on the first side latch engagement member 410 and the second side latch engagement member 412 can be helpful in preventing binding of the base latch member 304 with the display latch device 400. For example, normally the base latch member 304 will remain in the retracted position D until the display portion 206 is brought close enough to the base portion 202. However, after the base latch member 204 and the display latch device 400 are engaged, it may be possible to unlatched the display portion 206 from the base portion 202 (as described above with reference to FIGS. 5c and 5d) and slightly move the display portion 206 relative to the base portion 202 to reset one of the first side latch engagement member 410 or the second side latch engagement member 412 (depending on the mode of the IHS) without the base latch member 304 moving to the retracted position D. In this scenario, subsequent movement of the display portion 206 towards the base portion 202 will cause the base latch member 304 to bind (e.g., engage without latching) with the display latch device 400, and the chamfer lead-in on either the first side latch engagement member 410 or the second side latch engagement member 412 prevents such binding and allows the system to latch again.

The method 500 then proceeds to block 510 where a convertible IHS in provided in a second mode. In an embodiment, the convertible IHS 200 is converted to the tablet/slate mode illustrated and discussed above with reference to FIGS. 2a and 2b. The method 500 may then repeat blocks 504, 506, and 508 substantially as discussed above but with the display portion in a reversed orientation such that, once latched, the display portion 206 is in the orientation illustrated in FIG. 2b. One of skill in the art will recognize that the structure of the latch device 400 (e.g., the second latch member 402 and the first and second side latch engagement members 410 and 412) and the display portion 206 (e.g., the first and second display latch member apertures 210a and 210b) allow the display portion 206 to be latched to the base portion 202 such that the display screen 208 faces away from the top surface 202a of the base portion 202.

For example, once the display portion 206 is rotated 180 degrees about the axis 212a of the coupling 212 through the range of motion B such that positions of the rear surface 206b of the display portion 206 and the display screen 208 illustrated in FIG. 2a are reversed, the display portion 206 is moved through the range of motion A until the display portion 206 is positioned immediately adjacent the base portion 202, but now with rear surface 206b of the display screen 208 facing the top surface 202a of the base portion 202 such that the display screen 208 faces away from the top surface 206a of the base portion 206, as illustrated in FIG. 2b. As the display portion 206 is moved adjacent the base portion 202, the base member actuator 408 provides the force on the base latch member 304 that moves the base latch member 304 into the extended position E such that the base latch member 304 extends through the base latch member aperture 204 defined by the base portion 202, out past the top surface 202a of the base portion 202, through the second display latch member aperture 210b defined by the display portion 206, and into the housing 209 defined by the display portion 206 such that the a securing surface 304a on the base latch member 304 is located immediately adjacent the stop member 412e on the second side latch engagement member 412. With the base latch member 304 actuated, any attempt to move the display portion 206 away from the base portion 202 will be resisted by the engagement of the securing secure 304a on the base latch member 304 and the stop member 412e on the second side latch engagement member 412. Furthermore, with the stabilizer members 205 on the base portion 202 engaging the stabilizer members 211b on the display portion 206, movement of the display portion 206 relative to the base portion 202 in a plane that is parallel to the top surface 202a of the base portion 202 is resisted. The display portion 206 may then be unlatched from the base portion 202 using the first unlatching option that moves the display latch member 402 to engage the actuator portion 410c of first side latch engagement member 410 until the second release member 406b on the display latch member 402 engages the base latch member 304 and moves the base latch member 304 into the release position H so that the display portion 206 is unlatched from the base portion 202. The display portion 206 may also be unlatched from the base portion 202 using the second unlatching option and moving the display latch member 402 to cause the base 402a of the display latch member 402 to engage the actuator portion 412c of second side latch engagement member 412 until the stop member 412e on the second side latch engagement member 412 is no longer adjacent the securing surface 304a on the base latch member 304 so that the display portion 206 is unlatched from the base portion 202. One of skill in the art will appreciate that the latching system described above provides a user with one handed operation to latch and unlatch the an IHS in either of a laptop/notebook mode and a tablet/slate mode.

Figure 6:
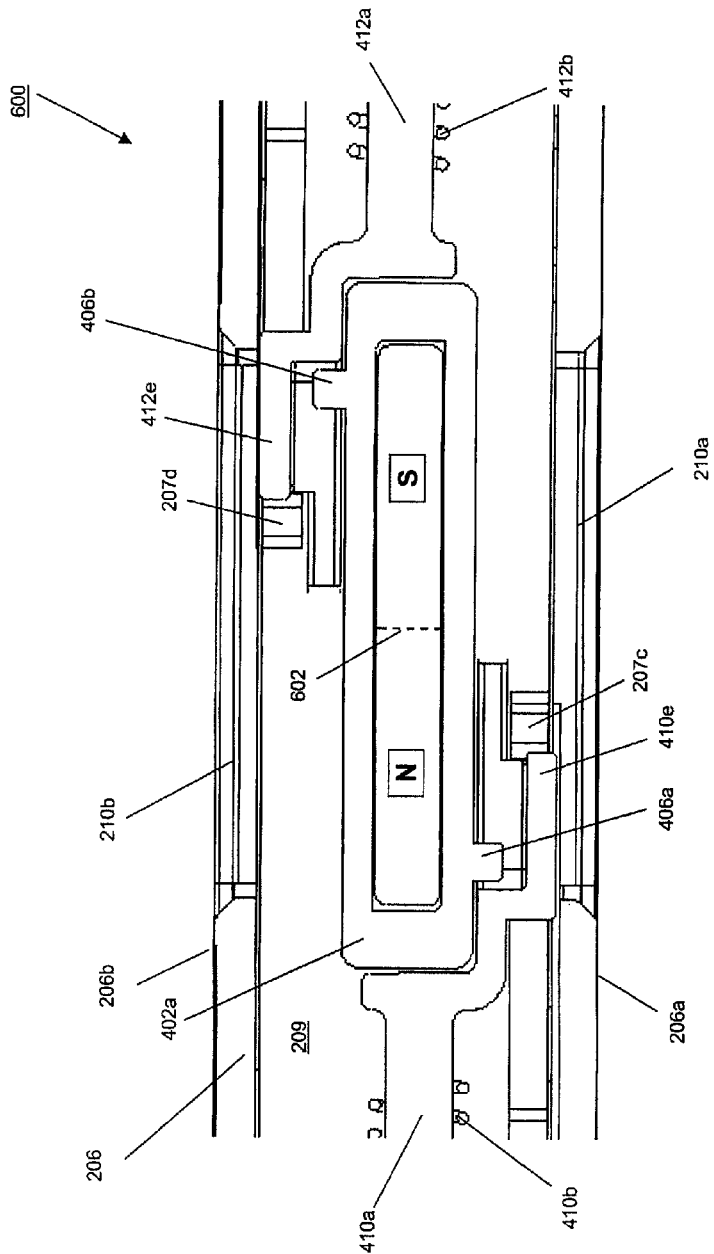
FIG. 6 is a cross-sectional view illustrating an embodiment the second latch device having a modified base latch member actuator.
Figure 7:
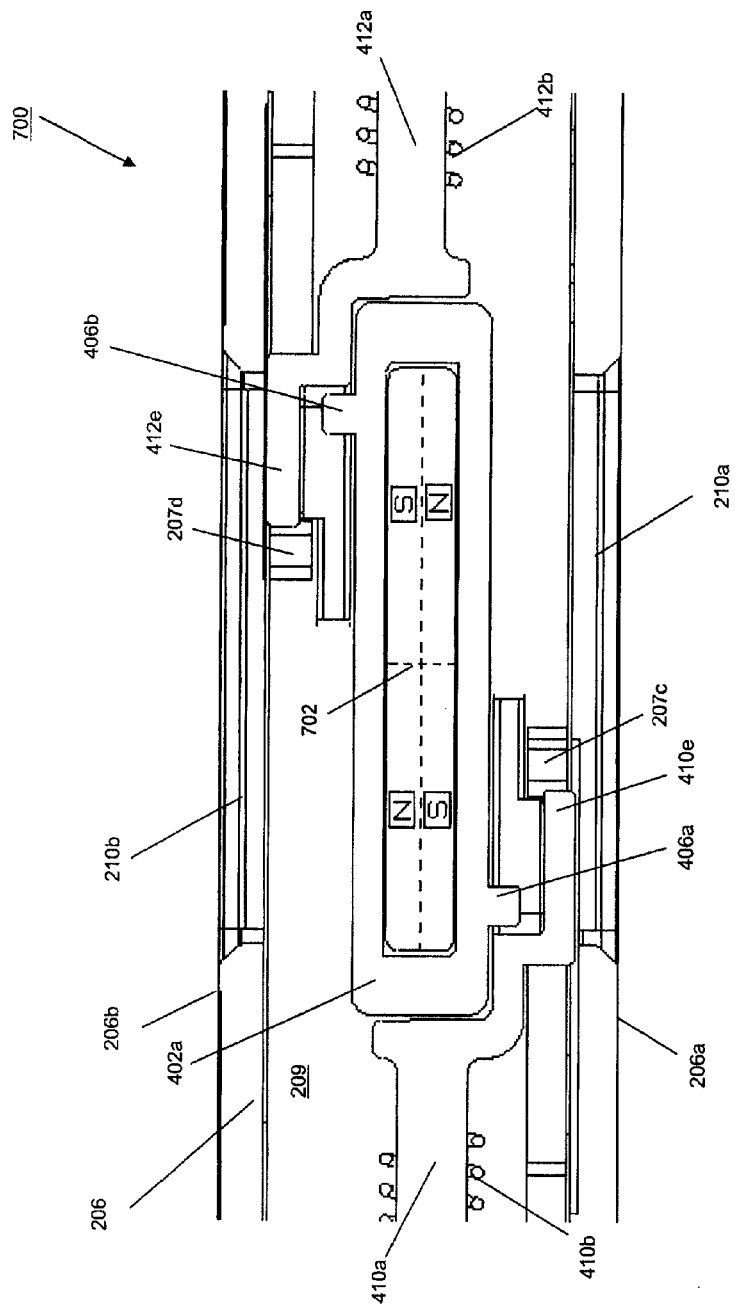
FIG. 7 is a cross-sectional view illustrating an embodiment the second latch device having a modified base latch member actuator.

Referring now to FIGS. 6 and 7, embodiments of display latch devices 600 and 700 are illustrated that are substantially similar to the display latch device 400 described above with reference to FIGS. 4a, 4b, 4c, 4d, 5a, 5b, 5c, and 5d, with the provision of a modified base member actuator 602 in the display latch device 600 and a modified base member actuator 702 in the display latch device 700 replacing the base member actuator device 408. The modified base member actuators 602 and 702 are magnets having specific pole orientations. For example, modified base member actuator 602 includes a pair of poles, with a N pole located adjacent the first side latch engagement member 410 and a S pole located adjacent the second side latch engagement member 412, while modified base member actuator 702 includes a four poles, with a stacked N pole and S pole located adjacent the first side latch engagement member 410 and a stacked S pole and N pole located adjacent the second side latch engagement member 412. In experimental embodiments, it has been found that pole placement and orientation can effect the actuation of the base latch member by creating a magnetic field that is better suited to position the base latching member 304 to latch the system. However, such an embodiment is not meant to limit the present disclosure, and a variety of simpler and more complex magnet are envisioned as falling within its scope.

Thus, a system and method are provided that allow a display portion on a convertible IHS to be latched to a base portion in either of a laptop/notebook mode and a tablet/slate mode. A first latch member remains retracted into the base portion when not in use for latching to prevent damage to the convertible IHS or injury to the user, and is then automatically drawn out of the base portion when the display portion is brought near in order to provide for latching. The system and method allow a user to then unlatch the display portion from the base portion by moving a second latch member in either of pair of directions such that the user does not need to determine the IHS mode to unlatch or remember an actuation direction for unlatching for each IHS mode. The second latch member for unlatching the system is included on the display portion, which reduces the possibility of re-latch that exists when the unlatching mechanism is included on the base portion (i.e., during the transition of the hand from the base portion to the display portion to lift the display portion.)

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A latching system, comprising:
a first component including a first latch member that is moveable relative to the first component;
a second component moveable relative to the first component, wherein a first side of the second component includes a first side latch engagement member and a second side of the second component includes a second side latch engagement member; and
a second latch member moveably coupled to the second component and including a first latch member actuator that is operable:
in response to positioning the first side of the second component adjacent the first component, to move the first latch member such that the first latch member is operable to engage the first side latch engagement member to resist movement of the second component relative to the first component, wherein the second latch member is movable in either of two directions to prevent the first latch member from engaging the first side latch engagement member such that the second component may be moved relative to the first component; and
in response to positioning the second side of the second component adjacent the first component, to move the first latch member such that the first latch member is operable to engage the second side latch engagement member to resist movement of the second component relative to the first component, wherein the second latch member is movable in either of two directions to prevent the first latch member from engaging the second side latch engagement member such that the second component may be moved relative to the first component.

2. The system of claim 1, wherein the first latch member is moveable between a first position in which the first latch member is operable to engage either the first side latch engagement member or the second side latch engagement member, and a second position in which the first latch member is not operable to engage either the first side latch engagement member or the second side latch engagement member, and wherein the first latch member is biased into the second position.

3. The system of claim 1, wherein the first side latch engagement member and the second side latch engagement member are each moveably coupled to the second component and each biased into a first latch member engagement position.

4. The system of claim 1, wherein with the first side of the second component positioned adjacent the first component:
the second latch member is moveable in a first direction such that the second latch member engages and moves the first side latch engagement member; and
the second latch member is moveable in a second direction such that the second latch member engages and moves the first latch member.

5. The system of claim 1, wherein with the second side of the second component positioned adjacent the second component:

the second latch member is moveable in a first direction such that the second latch member engages and moves the second side latch engagement member; and the second latch member is moveable in a second direction such that the second latch member engages and moves the first latch member.

6. The system of claim 1, wherein the first component defines an aperture, and wherein the first latch member is moveable relative to the first component between an first position in which the first latch member extends through the aperture and a second position in which the first latch member does not extend through the aperture.

7. The system of claim 1, wherein the first latch member includes a metal material and the first latch member actuator includes a magnet.

8. The system of claim 7, wherein the magnet includes at least 4 poles.

9. An information handling system, comprising:
 a base portion that houses a processor and a memory coupled to the processor, wherein the base portion includes a first latch member that is moveable relative to the base portion;
 a display portion that includes a display screen and that is moveable relative to the base portion, wherein a first side of the display portion includes a first side latch engagement member and a second side of the display portion includes a second side latch engagement member; and
 a second latch member that is moveably coupled to the display portion in two directions, and includes a first latch member actuator that is operable:
  in response to positioning the first side of the display portion adjacent the base portion, to move the first latch member such that the first latch member is operable to engage the first side latch engagement member to resist movement of the display portion relative to the base portion; and
  in response to positioning the second side of the display portion adjacent the base portion, to move the first latch member such that the first latch member is operable to engage the second side latch engagement member to resist movement of the display portion relative to the base portion
 wherein movement of the second latch member in either of the two directions is operable to prevent engagement of the first latch member and either of the first side latch engagement member and the second side latch engagement member.

10. The system of claim 9, wherein the first latch member is moveable between a first position in which the first latch member is operable to engage either the first side latch engagement member or the second side latch engagement member, and a second position in which the first latch member is not operable to engage either the first side latch engagement member or the second side latch engagement member, and wherein the first latch member is biased into the second position.

11. The system of claim 9, wherein the first side latch engagement member and the second side latch engagement member are each moveable relative to the display portion and each biased into a first latch member engagement position.

12. The system of claim 9, wherein with the first side of the display portion positioned adjacent the base portion:
 the second latch member is moveable in a first direction such that the second latch member engages and moves the first side latch engagement member; and
 the second latch member is moveable in a second direction such that the second latch member engages and moves the first latch member.

13. The system of claim 9, wherein with the second side of the display portion positioned adjacent the base portion:
 the second latch member is moveable in a first direction such that the second latch member engages and moves the second side latch engagement member; and
 the second latch member is moveable in a second direction such that the second latch member engages and moves the first latch member.

14. The system of claim 9, wherein the base portion defines an aperture, and wherein the first latch member is moveable relative to the base portion between an first position in which the first latch member extends through the aperture and a second position in which the first latch member does not extend through the aperture.

15. The system of claim 9, wherein the first latch member includes a metal material and the first latch member actuator includes a magnet.

16. The system of claim 15, wherein the magnet includes at least 4 poles.

17. A method for latching a convertible information handling system (IHS), comprising:
 providing an IHS comprising a base portion and a display portion that is moveable relative to the base portion, wherein the display portion includes a first side and a second side that is located opposite the display portion from the first side;
 latching the display portion to the base portion in a first IHS mode, wherein the latching comprises:
  moving the first side of the display portion adjacent the base portion such that a first latch member actuator in the display portion moves a first latch member in the base portion into a latching position; and
  resisting the movement of the display portion relative to the base portion through the engagement of a first side latch engagement member in the display portion and the first latch member in the base portion; and
 latching the display portion to the base portion in a second IHS mode, wherein the latching comprises:
  moving the second side of the display portion adjacent the base portion such that the first latch member actuator in the display portion moves the first latch member in the base portion into the latching position; and
  resisting the movement of the display portion relative to the base portion through the engagement of a second side latch engagement member in the display portion and the first latch member in the base portion
 unlatching the display portion from the base portion in either the first IHS mode or the second IHS mode by:
  moving the second latch member in either of two directions.

18. The method of claim 17, further comprising:
 unlatching the display portion from the base portion in the first IHS mode by:
  moving the second latch member in the display portion in a first direction and into engagement with the first side latch engagement member to move the first side latch engagement member and prevent the first side latch engagement member from engaging the first latch member; and
 unlatching the display portion from the base portion in the second IHS mode by:

moving the second latch member in the display portion in a second direction and into engagement with the first latch member to move the first latch member and prevent the first latch member from engaging the first side latch engagement member.

19. The method of claim 17, further comprising:

unlatching the display portion from the base portion in the first IHS mode by:
  moving the second latch member in the display portion in a first direction and into engagement with the second side latch engagement member to move the second side latch engagement member and prevent the second side latch member from engaging the first latch member; and unlatching the display portion from the base portion in the second IHS mode by:
  moving the second latch member in the display portion in a second direction and into engagement with the first latch member to move the first latch member and prevent the first latch member from engaging the second side latch engagement member.

20. The method of claim 17, wherein the moving the first latch member into the latching position comprising moving the first latch member from a rest position in which the first latch member is housed in the base portion to the latching position in which the first latch member extends through an aperture defined by the base portion.

* * * * *